United States Patent
Schilling

(10) Patent No.: US 7,169,540 B2
(45) Date of Patent: *Jan. 30, 2007

(54) METHOD OF TREATMENT OF POROUS DIELECTRIC FILMS TO REDUCE DAMAGE DURING CLEANING

(75) Inventor: Paul Schilling, Granite Bay, CA (US)

(73) Assignee: Tokyo Electron Limited, Tokyo (JP)

( * ) Notice: Subject to any disclaimer, the term of this patent is extended or adjusted under 35 U.S.C. 154(b) by 86 days.

This patent is subject to a terminal disclaimer.

(21) Appl. No.: 10/412,121

(22) Filed: Apr. 11, 2003

(65) Prior Publication Data

US 2004/0018452 A1    Jan. 29, 2004

Related U.S. Application Data

(63) Continuation-in-part of application No. 10/379,984, filed on Mar. 4, 2003.

(60) Provisional application No. 60/372,822, filed on Apr. 12, 2002.

(51) Int. Cl.
G03F 7/00 (2006.01)

(52) U.S. Cl. ............ 430/329; 430/322; 430/311; 134/1

(58) Field of Classification Search ........ 430/311, 430/313, 315, 322, 324, 325, 329, 330; 134/1, 134/1.3

See application file for complete search history.

(56) References Cited

U.S. PATENT DOCUMENTS

| | | |
|---|---|---|
| 2,439,689 A | 4/1948 | Hyde et al. |
| 2,617,719 A | 11/1952 | Stewart |
| 3,642,020 A | 2/1972 | Payne |
| 3,890,176 A | 6/1975 | Bolon |
| 3,900,551 A | 8/1975 | Bardoncelli et al. |
| 4,219,333 A | 8/1980 | Harris |
| 4,341,592 A | 7/1982 | Shortes et al. |
| 4,349,415 A | 9/1982 | DeFilippi et al. |
| 4,475,993 A | 10/1984 | Blander et al. |
| 4,749,440 A | 6/1988 | Blackwood et al. |
| 4,838,476 A | 6/1989 | Rahn |
| 4,877,530 A | 10/1989 | Moses |
| 4,879,004 A | 11/1989 | Oesch et al. |
| 4,923,828 A | 5/1990 | Gluck et al. |
| 4,925,790 A | 5/1990 | Blanch et al. |
| 4,933,404 A | 6/1990 | Beckman et al. |
| 4,944,837 A | 7/1990 | Nishikawa et al. |
| 5,011,542 A | 4/1991 | Weil |
| 5,013,366 A | 5/1991 | Jackson et al. |
| 5,068,040 A | 11/1991 | Jackson |
| 5,071,485 A | 12/1991 | Matthews et al. |
| 5,091,207 A | 2/1992 | Tanaka |
| 5,105,556 A | 4/1992 | Kurokawa et al. |
| 5,158,704 A | 10/1992 | Fulton et al. |
| 5,174,917 A | 12/1992 | Monzyk |
| 5,185,058 A | 2/1993 | Cathey, Jr. |
| 5,185,296 A | 2/1993 | Morita et al. |
| 5,196,134 A | 3/1993 | Jackson |
| 5,201,960 A | 4/1993 | Starov |
| 5,213,619 A | 5/1993 | Jackson et al. |
| 5,215,592 A | 6/1993 | Jackson |
| 5,225,173 A | 7/1993 | Wai |
| 5,236,602 A | 8/1993 | Jackson |
| 5,237,824 A | 8/1993 | Pawliszyn |
| 5,238,671 A | 8/1993 | Matson et al. |
| 5,250,078 A | 10/1993 | Saus et al. |
| 5,261,965 A | 11/1993 | Moslehi |
| 5,266,205 A | 11/1993 | Fulton et al. |
| 5,269,815 A | 12/1993 | Schlenker et al. |
| 5,269,850 A | 12/1993 | Jackson |
| 5,274,129 A | 12/1993 | Natale |
| 5,285,352 A | 2/1994 | Pastore et al. |
| 5,288,333 A | 2/1994 | Tanaka et al. |
| 5,290,361 A | 3/1994 | Hayashida et al. |
| 5,294,261 A | 3/1994 | McDermott et al. |
| 5,298,032 A | 3/1994 | Schlenker et al. |
| 5,304,515 A | 4/1994 | Morita et al. |
| 5,306,350 A | 4/1994 | Hoy et al. |
| 5,312,882 A | 5/1994 | DeSimone et al. |
| 5,314,574 A | 5/1994 | Takahashi |
| 5,316,591 A | 5/1994 | Chao et al. |
| 5,320,742 A | 6/1994 | Fletcher et al. |

(Continued)

FOREIGN PATENT DOCUMENTS

EP    0 283 740 A2    9/1988

(Continued)

OTHER PUBLICATIONS

R. F. Reidy et al., "Effects of Supercritical Processing on Ultra Low-K Films", Dept. of Materials Science, Oct. 13, 2002, pp. 1 of 5.

(Continued)

Primary Examiner—Kathleen Duda
(74) Attorney, Agent, or Firm—Haverstock & Owens LLP

(57) ABSTRACT

A device, method, and system for treating low-k dielectric material films to reduce damage during microelectronic component cleaning processes is disclosed. The current invention cleans porous low-k dielectric material films in a highly selectivity with minimal dielectric material damage by first treating microelectronic components to a passivating process followed by a cleaning solution process.

28 Claims, 4 Drawing Sheets

U.S. PATENT DOCUMENTS

| | | |
|---|---|---|
| 5,328,722 A | 7/1994 | Ghanayem et al. |
| 5,334,332 A | 8/1994 | Lee |
| 5,334,493 A | 8/1994 | Fujita et al. |
| 5,352,327 A | 10/1994 | Witowski |
| 5,356,538 A | 10/1994 | Wai et al. |
| 5,364,497 A | 11/1994 | Chau et al. |
| 5,370,740 A | 12/1994 | Chao et al. |
| 5,370,741 A | 12/1994 | Bergman |
| 5,370,742 A | 12/1994 | Mitchell et al. |
| 5,401,322 A | 3/1995 | Marshall |
| 5,403,621 A | 4/1995 | Jackson et al. |
| 5,403,665 A | 4/1995 | Alley et al. |
| 5,417,768 A | 5/1995 | Smith, Jr. et al. |
| 5,456,759 A | 10/1995 | Stanford, Jr. et al. |
| 5,470,393 A | 11/1995 | Fukazawa |
| 5,474,812 A | 12/1995 | Truckenmuller et al. |
| 5,482,564 A | 1/1996 | Douglas et al. |
| 5,486,212 A | 1/1996 | Mitchell et al. |
| 5,494,526 A | 2/1996 | Paranjpe |
| 5,500,081 A | 3/1996 | Bergman |
| 5,501,761 A | 3/1996 | Evans et al. |
| 5,514,220 A | 5/1996 | Wetmore et al. |
| 5,522,938 A | 6/1996 | O'Brien |
| 5,547,774 A | 8/1996 | Gimzewski et al. |
| 5,550,211 A | 8/1996 | DeCrosta et al. |
| 5,580,846 A | 12/1996 | Hayashida et al. |
| 5,589,082 A | 12/1996 | Lin et al. |
| 5,589,105 A | 12/1996 | DeSimone et al. |
| 5,629,918 A | 5/1997 | Ho et al. |
| 5,632,847 A | 5/1997 | Ohno et al. |
| 5,635,463 A | 6/1997 | Muraoka |
| 5,637,151 A | 6/1997 | Schulz |
| 5,641,887 A | 6/1997 | Beckman et al. |
| 5,656,097 A | 8/1997 | Olesen et al. |
| 5,665,527 A | 9/1997 | Allen et al. |
| 5,676,705 A | 10/1997 | Jureller et al. |
| 5,679,169 A | 10/1997 | Gonzales et al. |
| 5,679,171 A | 10/1997 | Saga et al. |
| 5,683,473 A | 11/1997 | Jureller et al. |
| 5,683,977 A | 11/1997 | Jureller et al. |
| 5,688,879 A | 11/1997 | DeSimone |
| 5,700,379 A | 12/1997 | Biebl |
| 5,714,299 A | 2/1998 | Combes et al. |
| 5,725,987 A | 3/1998 | Combes et al. |
| 5,726,211 A | 3/1998 | Hedrick et al. |
| 5,730,874 A | 3/1998 | Wai et al. |
| 5,736,425 A | 4/1998 | Smith et al. |
| 5,739,223 A | 4/1998 | DeSimone |
| 5,766,367 A | 6/1998 | Smith et al. |
| 5,783,082 A | 7/1998 | DeSimone et al. |
| 5,797,719 A | 8/1998 | James et al. |
| 5,798,438 A | 8/1998 | Sawan et al. |
| 5,804,607 A | 9/1998 | Hedrick et al. |
| 5,807,607 A | 9/1998 | Smith et al. |
| 5,847,443 A | 12/1998 | Cho et al. |
| 5,866,005 A | 2/1999 | DeSimone et al. |
| 5,868,856 A | 2/1999 | Douglas et al. |
| 5,868,862 A | 2/1999 | Douglas et al. |
| 5,872,061 A | 2/1999 | Lee et al. |
| 5,872,257 A | 2/1999 | Beckman et al. |
| 5,873,948 A | 2/1999 | Kim |
| 5,881,577 A | 3/1999 | Sauer et al. |
| 5,888,050 A | 3/1999 | Fitzgerald et al. |
| 5,893,756 A | 4/1999 | Berman et al. |
| 5,896,870 A | 4/1999 | Huynh et al. |
| 5,900,354 A | 5/1999 | Batchelder |
| 5,904,737 A | 5/1999 | Preston et al. |
| 5,908,510 A | 6/1999 | McCullough et al. |
| 5,928,389 A | 7/1999 | Jevtic |
| 5,932,100 A | 8/1999 | Yager et al. |
| 5,944,996 A | 8/1999 | DeSimone et al. |
| 5,955,140 A | 9/1999 | Smith et al. |
| 5,965,025 A | 10/1999 | Wai et al. |
| 5,976,264 A | 11/1999 | McCullough et al. |
| 5,980,648 A | 11/1999 | Adler |
| 5,992,680 A | 11/1999 | Smith |
| 5,994,696 A | 11/1999 | Tai et al. |
| 6,005,226 A | 12/1999 | Aschner et al. |
| 6,017,820 A | 1/2000 | Ting et al. |
| 6,021,791 A | 2/2000 | Dryer et al. ............. 134/100.1 |
| 6,024,801 A | 2/2000 | Wallace et al. |
| 6,037,277 A | 3/2000 | Masakara et al. |
| 6,063,714 A | 5/2000 | Smith et al. |
| 6,067,728 A | 5/2000 | Farmer et al. |
| 6,099,619 A | 8/2000 | Lansbarkis et al. |
| 6,100,198 A | 8/2000 | Grieger et al. |
| 6,110,232 A | 8/2000 | Chen et al. |
| 6,114,044 A | 9/2000 | Houston et al. |
| 6,128,830 A | 10/2000 | Bettcher et al. |
| 6,140,252 A | 10/2000 | Cho et al. |
| 6,149,828 A | 11/2000 | Vaartstra |
| 6,171,645 B1 | 1/2001 | Smith et al. |
| 6,200,943 B1 | 3/2001 | Romack et al. |
| 6,216,364 B1 | 4/2001 | Tanaka et al. |
| 6,224,774 B1 | 5/2001 | DeSimone et al. |
| 6,228,563 B1 | 5/2001 | Starov et al. |
| 6,228,826 B1 | 5/2001 | DeYoung et al. |
| 6,232,238 B1 | 5/2001 | Chang et al. |
| 6,232,417 B1 | 5/2001 | Rhodes et al. |
| 6,239,038 B1 | 5/2001 | Wen |
| 6,242,165 B1 | 6/2001 | Vaartstra |
| 6,251,250 B1 | 6/2001 | Keigler |
| 6,255,732 B1 | 7/2001 | Yokoyama et al. ......... 257/760 |
| 6,270,531 B1 | 8/2001 | DeYoung et al. |
| 6,270,948 B1 | 8/2001 | Sato et al. |
| 6,277,753 B1 | 8/2001 | Mullee et al. |
| 6,284,558 B1 | 9/2001 | Sakamoto |
| 6,286,231 B1 | 9/2001 | Bergman et al. |
| 6,306,564 B1 | 10/2001 | Mullee |
| 6,319,858 B1 | 11/2001 | Lee et al. .................... 438/787 |
| 6,331,487 B2 | 12/2001 | Koch |
| 6,333,268 B1 | 12/2001 | Starov et al. |
| 6,344,243 B1 | 2/2002 | McClain et al. |
| 6,358,673 B1 | 3/2002 | Namatsu |
| 6,361,696 B1 | 3/2002 | Spiegelman et al. |
| 6,367,491 B1 | 4/2002 | Marshall et al. |
| 6,380,105 B1 | 4/2002 | Smith et al. ................. 438/778 |
| 6,425,956 B1 | 7/2002 | Cotte et al. |
| 6,436,824 B1 | 8/2002 | Chooi et al. |
| 6,454,945 B1 | 9/2002 | Weigl et al. |
| 6,458,494 B2 | 10/2002 | Song et al. |
| 6,461,967 B2 | 10/2002 | Wu et al. |
| 6,465,403 B1 | 10/2002 | Skee |
| 6,485,895 B1 | 11/2002 | Choi et al. |
| 6,486,078 B1 | 11/2002 | Rangarajan et al. |
| 6,492,090 B2 | 12/2002 | Nishi et al. |
| 6,500,605 B1 | 12/2002 | Mullee et al. |
| 6,509,141 B2 | 1/2003 | Mullee |
| 6,537,916 B2 | 3/2003 | Mullee et al. .............. 438/692 |
| 6,558,475 B1 | 5/2003 | Jur et al. |
| 6,562,146 B1 | 5/2003 | DeYoung et al. ............. 134/30 |
| 6,596,093 B2 | 7/2003 | DeYoung et al. |
| 6,635,565 B2 | 10/2003 | Wu et al. |
| 6,641,678 B2 | 11/2003 | DeYoung et al. |
| 6,764,552 B1 | 7/2004 | Joyce et al. .................... 134/3 |
| 6,890,853 B2 | 5/2005 | Biberger et al. |
| 7,044,143 B2 | 5/2006 | DeYoung et al. ............ 134/105 |
| 2001/0019857 A1 | 9/2001 | Yokoyama et al. ......... 438/142 |
| 2001/0024247 A1 | 9/2001 | Nakata |
| 2001/0041455 A1 | 11/2001 | Yun et al. |
| 2001/0041458 A1 | 11/2001 | Ikakura et al. .............. 438/778 |
| 2002/0001929 A1 | 1/2002 | Biberger et al. |
| 2002/0055323 A1 | 5/2002 | McClain et al. |
| 2002/0074289 A1 | 6/2002 | Sateria et al. |

| | | |
|---|---|---|
| 2002/0081533 A1 | 6/2002 | Simons et al. |
| 2002/0088477 A1 | 7/2002 | Cotte et al. |
| 2002/0098680 A1 | 7/2002 | Goldstein et al. |
| 2002/0106867 A1 | 8/2002 | Yang et al. |
| 2002/0112740 A1 | 8/2002 | DeYoung et al. |
| 2002/0112746 A1 | 8/2002 | DeYoung et al. |
| 2002/0115022 A1 | 8/2002 | Messick et al. |
| 2002/0117391 A1 | 8/2002 | Beam |
| 2002/0123229 A1 | 9/2002 | Ono et al. |
| 2002/0127844 A1 | 9/2002 | Grill et al. |
| 2002/0132192 A1 | 9/2002 | Namatsu |
| 2002/0141925 A1 | 10/2002 | Wong et al. |
| 2002/0142595 A1 | 10/2002 | Chiou |
| 2002/0150522 A1 | 10/2002 | Heim et al. |
| 2002/0164873 A1 | 11/2002 | Masuda et al. ............. 438/689 |
| 2003/0003762 A1 | 1/2003 | Cotte et al. |
| 2003/0008238 A1 | 1/2003 | Goldfarb et al. |
| 2003/0008518 A1 | 1/2003 | Chang et al. ............... 438/745 |
| 2003/0013311 A1 | 1/2003 | Chang et al. |
| 2003/0036023 A1 | 2/2003 | Moreau et al. |
| 2003/0047533 A1 | 3/2003 | Reid et al. |
| 2003/0051741 A1 | 3/2003 | DeSimone et al. |
| 2003/0106573 A1 | 6/2003 | Masuda et al. ............... 134/26 |
| 2003/0125225 A1 | 7/2003 | Xu et al. .................... 510/175 |
| 2003/0217764 A1 | 11/2003 | Masuda et al. ............... 134/26 |
| 2004/0087457 A1 | 5/2004 | Korzenski et al. .......... 510/177 |
| 2004/0103922 A1 | 6/2004 | Inoue et al. .................. 134/26 |
| 2004/0112409 A1 | 6/2004 | Schilling ..................... 134/26 |
| 2004/0134515 A1 | 7/2004 | Castrucci |
| 2004/0177867 A1 | 9/2004 | Schilling ..................... 134/26 |
| 2006/0003592 A1 | 1/2006 | Gale et al. .................. 438/745 |

FOREIGN PATENT DOCUMENTS

| | | |
|---|---|---|
| EP | 0 391 035 A2 | 10/1990 |
| EP | 0 518 653 B1 | 12/1992 |
| EP | 0 536 752 A2 | 4/1993 |
| EP | 0 572 913 A1 | 12/1993 |
| EP | 0 620 270 A3 | 10/1994 |
| EP | 0 679 753 B1 | 11/1995 |
| EP | 0 711 864 B1 | 5/1996 |
| EP | 0 726 099 A2 | 8/1996 |
| EP | 0 727 711 A2 | 8/1996 |
| JP | 60-192333 | 9/1985 |
| JP | 1-045131 | 2/1989 |
| JP | 2-209729 | 8/1990 |
| JP | 2-304941 | 12/1990 |
| JP | 7-142333 | 6/1995 |
| JP | 8-186140 | 7/1996 |
| JP | 8-222508 | 8/1996 |
| WO | WO 90/06189 | 6/1990 |
| WO | WO 93/14255 | 7/1993 |
| WO | WO 93/14259 | 7/1993 |
| WO | WO 93/20116 | 10/1993 |
| WO | WO 96/27704 | 9/1996 |
| WO | WO 99/49998 | 10/1999 |
| WO | WO 00/73241 A1 | 12/2000 |
| WO | WO 01/33613 A2 | 5/2001 |
| WO | WO 02/09894 A2 | 2/2002 |
| WO | WO 02/11191 A2 | 2/2002 |
| WO | WO 02/16051 A2 | 2/2002 |

OTHER PUBLICATIONS

"NSF/SRC Engineering Research Center for Environmentally Benign Semiconductor Manufacturing", http://www.erc.arizona.edu/seminar/schedule2003.htm, May 15, 2003, 1 page.

J.B. Rubin et al. "A Comparison of Chilled DI Water/Ozone and Co2-Based Supercritical Fluids as Replacements for Photoresist-Stripping Solvents", IEEE/CPMT Int'l Electronics Manufacturing/Technology Symposium, 1998, pp. 308-314.

"Los Almos National Laboratory," Solid State Technology, pp. S10 & S14, Oct. 1998.

"Supercritical Carbon Dioxide Resist Remover, SCORR, the Path to Least Photoresistance," Los Alamos National Laboratory, 1998.

Guan, Z. et al., "Fluorocarbon-Based Heterophase Polymeric Materials. 1. Block Copolymer Surfactants for Carbon Dioxide Applications," Macromolecules, vol. 27, 1994, pp. 5527-5532.

International Journal of Environmentally Conscious Design & Manufacturing, vol. 2, No. 1, 1993, p. 83.

Matson and Smith "Supercritical Fluids", Journal of the American Ceramic Society, vol. 72, No. 6, pp. 872-874.

Ziger, D.H. et al., "Compressed Fluid Technology: Application to RIE Developed Resists," AIChE Journal, vol. 33, No. 10, Oct. 1987, pp. 1585-1591.

Kirk-Othmer,"Alcohol Fuels to Toxicology," Encyclopedia of Chemical Terminology, 3rd ed., Supplement Volume, New York: John Wiley & Sons, 1984, pp. 872-893.

"Cleaning with Supercritical $CO_2$," NASA Tech Briefs, MFS-29611, Marshall Space Flight Center, Alabama, Mar. 1979.

Basta, N., "Supercritical Fluids: Still Seeking Acceptance," Chemical Engineering, vol. 92, No. 3, Feb. 24, 1985, p. 14.

Takahashi, D., "Los Alamos Lab Finds Way to Cut Chip Toxic Waste," Wall Street Journal, Jun. 22, 1998.

"Supercritical CO2 Process Offers Less Mess from Semiconductor Plants", Chemical Engineering Magazine, pp. 27 & 29, Jul. 1998.

Sun, Y.P. et al., "Preparation of Polymer-Protected Semiconductor Nanoparticles Through the Rapid Expansion of Supercritical Fluid Solution," Chemical Physics Letters, pp. 585-588, May 22, 1998.

Jackson, K. et al., "Surfactants and Micromulsions in Supercritical Fluids," Supercritical Fluid Cleaning. Noyes Publications, Westwood, NJ, pp. 87-120, Spring 1998.

Kryszewski, M., "Production of Metal and Semiconductor Nanoparticles in Polymer Systems," Polimery, pp. 65-73, Feb. 1998, abstract only.

Bakker, G.L. et al., "Surface Cleaning and Carbonaceous Film Removal Using High Pressure, High Temperature Water, and Water/CO2 Mixtures," J. Electrochem. Soc, vol. 145, No. 1, pp. 284-291, Jan. 1998.

Ober, C.K. et al., "Imaging Polymers with Supercritical Carbon Dioxide," Advanced Materials, vol. 9, No. 13, 1039-1043, Nov. 3, 1997.

Russick, E.M. et al., "Supercritical Carbon Dioxide Extraction of Solvent from Micro-machined Structures." Supercritical Fluids Extraction and Pollution Prevention, ACS Symposium Series, vol. 670, pp. 255-269, Oct. 21, 1997.

Dahmen, N. et al., "Supercritical Fluid Extraction of Grinding and Metal Cutting Waste Contaminated with Oils," Supercritical Fluids—Extraction and Pollution Prevention, ACS Symposium Series, vol. 670, pp. 270-279, Oct. 21, 1997.

Wai, C.M., "Supercritical Fluid Extraction: Metals as Complexes," Journal of Chromatography A, vol. 785, pp. 369-383, Oct. 17, 1997.

Xu, C. et al., "Submicron-Sized Spherical Yttrium Oxide Based Phosphors Prepared by Supercritical CO2-Assisted aerosolization and pyrolysis," Appl. Phys. Lett., vol. 71, No. 12, Sep. 22, 1997, pp. 1643-1645.

Tomioka Y. et al., "Decomposition of Tetramethylammonium (TMA) in a Positive Photo-resist Developer by Supercritical Water," Abstracts of Papers 214th ACS Natl Meeting, American Chemical Society, Abstract No. 108, Sep. 7, 1997.

Klein, H. et al., "Cyclic Organic Carbonates Serve as Solvents and Reactive Diluents," Coatings World, pp. 38-40, May 1997.

Bühler, J. et al., Linear Array of Complementary Metal Oxide Semiconductor Double-Pass Metal Micro-mirrors, Opt. Eng., vol. 36, No. 5, pp. 1391-1398, May 1997.

Jo, M.H. et al., Evaluation of SIO2 Aerogel Thin Film with Ultra Low Dielectric Constant as an Intermetal Dielectric, Microelectronic Engineering, vol. 33, pp. 343-348, Jan. 1997.

McClain, J.B. et al., "Design of Nonionic Surfactants for Supercritical Carbon Dioxide," Science, vol. 274, Dec. 20, 1996. pp. 2049-2052.

Znaidi, L. et al., "Batch and Semi-Continuous Synthesis of Magnesium Oxide Powders from Hydrolysis and Supercritical Treatment of Mg(OCH3)2," Materials Research Bulletin, vol. 31, No. 12, pp. 1527-1335, Dec. 1996.

Tadros, M.E., "Synthesis of Titanium Dioxide Particles in Supercritical $CO_2$," J. Supercritical Fluids, vol. 9, pp. 172-176, Sep. 1996.

Courtecuisse, V.G. et al., "Kinetics of the Titanium Isopropoxide Decomposition in Supercritical Isopropyl Alcohol," Ind. Eng. Chem. Res., vol. 35, No. 8, pp. 2539-2545, Aug. 1996.

Gabor, A, et al., "Block and Random Copolymer resists Designed for 193 nm Lithography and Environmentally Friendly Supercritical CO2 Development," , SPIE, vol. 2724, pp. 410-417, Jun. 1996.

Schimek, G. L. et al., "Supercritical Ammonia Synthesis and Characterization of Four New Alkali Metal Silver Antimony Sulfides . . . ," J. Solid State Chemistry, vol. 123 pp. 277-284, May 1996.

Gallagher-Wetmore, P. et al., "Supercritical Fluid Processing: Opportunities for New Resist Materials and Processes," SPIE, vol. 2725, pp. 289-299, Apr. 1996.

Papathomas, K.I. et al., "Debonding of Photoresists by Organic Solvents," J. Applied Polymer Science, vol. 59, pp. 2029-2037, Mar. 28, 1996.

Watkins, J.J. et al., "Polymer/metal Nanocomposite Synthesis in Supercritical CO2," Chemistry of Materials, vol. 7, No. 11, Nov. 1995., pp. 1991-1994.

Gloyna, E.F. et al., "Supercritical Water Oxidation Research and Development Update," Environmental Progress, vol. 14, No. 3. pp. 182-192, Aug. 1995.

Gallagher-Wetmore, P. et al., "Supercritical Fluid Processing: A New Dry Technique for Photoresist Developing," SPIE vol. 2438, pp. 694-708, Jun. 1995.

Gabor, A. H. et al., "Silicon-Containing Block Copolymer Resist Materials," Microelectronics Technology—Polymers for Advanced Imaging and Packaging , ACS Symposium Series, vol. 614, pp. 281-298, Apr. 1995.

Tsiartas, P.C. et al., "Effect of Molecular weight Distribution on the Dissolution Properties of Novolac Blends," SPIE, vol. 2438, pp. 264-271, Jun. 1995.

Allen, R.D. et al., "Performance Properties of Near-monodisperse Novolak Resins,"SPIE, vol. 2438, pp. 250-260, Jun. 1995.

Wood, P.T. et al., "Synthesis of New Channeled Structures in Supercritical Amines . . . ," Inorg. Chem., vol. 33, pp. 1556-1558, 1994.

Jerome, J.E. et al., "Synthesis of New Low-Dimensional Quaternary Compounds . . . ," Inorg. Chem, vol. 33, pp. 1733-1734, 1994.

McHardy, J. et al., "Progress in Supercritical CO2 Cleaning," SAMPE Jour., vol. 29, No. 5, pp. 20-27, Sep. 1993.

Purtell, R, et al., "Precision Parts Cleaning using Supercritical Fluids," J. Vac, Sci, Technol. A. vol. 11, No. 4, Jul. 1993, pp. 1696-1701.

Bok, E, et al., "Supercritical Fluids for Single Wafer Cleaning," Solid State Technology, pp. 117-120, Jun. 1992.

Adschiri, T. et al., "Rapid and Continuous Hydrothermal Crystallization of Metal Oxide Particles in Supercritical Water," J. Am. Ceram. Soc., vol. 75, No. 4, pp. 1019-1022, 1992.

Hansen, B.N. et al., "Supercritical Fluid Transport—Chemical Deposition of Films,"Chem. Mater., vol. 4, No. 4, pp. 749-752, 1992.

Page, S.H. et al., "Predictability and Effect of Phase Behavior of CO2/ Propylene Carbonate in Supercritical Fluid Chromatography," J. Microcol, vol. 3, No. 4, pp. 355-369, 1991.

Brokamp, T. et al., "Synthesis und Kristallstruktur Eines Gemischtvalenten Lithium-Tantalnitrids $Li_2Ta_3N_5$," J. Alloys and Compounds, vol. 176. pp. 47-60, 1991, abstract only.

Hybertson, B.M. et al., "Deposition of Palladium Films by a Novel Supercritical Fluid Transport Chemical Deposition Process," Mat. Res. Bull., vol. 26, pp. 1127-1133, 1991.

Ziger, D. H. et al., "Compressed Fluid Technology: Application to RIE-Developed Resists," AiChE Jour., vol. 33, No. 10, pp. 1585-1591, Oct. 1987.

Matson, D.W. et al., "Rapid Expansion of Supercritical Fluid Solutions: Solute Formation of Powders, Thin Films, and Fibers," Ind. Eng. Chem. Res., vol. 26, No. 11, pp. 2298-2306, 1987.

Tolley, W.K. et al., "Stripping Organics from Metal and Mineral Surfaces using Supercritical Fluids," Separation Science and Technology, vol. 22, pp. 1087-1101, 1987.

"Final Report on the Safety Assessment of Propylene Carbonate", J. American College of Toxicology, vol. 6, No. 1, pp. 23-51, 1987.

"Porous Xerogel Films as Ultra-Low Permittivity Dielectrics for ULSI Interconnect Applications", Materials Research Society, pp. 463-469, 1997.

Kawakami et al, "How Super Low-k (k=1.1) Silica Aerogel Film Using Supercritical Drying Technique", IEEE, pp. 143-145, 2000.

D. Goldfarb et al., A"Aqueous-based Photoresist Drying Using Supercritical Carbon Dioxide to Prevent Pattern Collapse", J. Vacuum Sci. Tech. B 18 (6), 3313 (2000).

H. Namatsu et al., "Supercritical Drying for Water-Rinsed Resist Systems", J. Vacuum Sci. Tech B 18 (6), 3308 (2000).

N. Sundararajan et al., "Supercritical CO2 Processing for Submicron Imaging of Fluoropolymers", Chem. Mater. 12, 41 (2000).

METHOD OF TREATMENT OF POROUS DIELECTRIC FILMS TO REDUCE DAMAGE DURING CLEANING

RELATED APPLICATION(S)

This Patent Application is a continuation in part of U.S. patent application, Ser. No. 10/379,984, filed on Mar. 4, 2003, and entitled "METHOD OF PASSIVATING OF LOW DIELECTRIC MATERIALS IN WAFER PROCESSING". This Patent Application claims priority under 35 U.S.C. 119(e) of the U.S. Provisional Patent Application, Ser. No. 60/372,822 filed Apr. 12, 2002, and entitled "METHOD OF TREATMENT OF POROUS DIELECTRIC FILMS TO REDUCE DAMAGE DURING CLEANING". The Provisional Patent Application, Ser. No. 60/372,822 filed Apr. 12, 2002, and entitled "METHOD OF TREATMENT OF POROUS DIELECTRIC FILMS TO REDUCE DAMAGE DURING CLEANING", and the U.S. patent application Ser. No. 10/379,984, filed Mar. 4, 2003, and entitled "METHOD OF PASSIVATING OF LOW DIELECTRIC MATERIALS IN WAFER PROCESSING" are also hereby incorporated by reference.

FIELD OF THE INVENTION

This invention relates to the field of cleaning of dielectric films. More particularly, this invention relates to systems, devices for, and methods of treating low-k dielectric material films to reduce damage during cleaning.

BACKGROUND OF THE INVENTION

A recent advancement in semiconductor technology involves the replacement of dielectric materials used for insulating interconnects with low-k dielectric materials. Low-k dielectric materials are currently being integrated as interlevel dielectric materials. The three main categories of low-k dielectric materials include: inorganic ($SiO_2$ based material); hybrid (organic functionalized inorganic matrix), and organic materials. This shift to using low-k dielectric materials has required photoresist stripping to evolve to meet higher requirements for cleanliness and residue removal, without adding cost and affecting throughput.

By using the low-k dielectric materials for insulating the interconnects, smaller geometry interconnect structures can be built resulting in faster integrated circuits. Porous low-k dielectric materials are a particular class of these low-k dielectric materials. When etching lines and vias in the porous low-k dielectric materials, silanol groups tend to form on surfaces within the lines and the vias. The silanol groups also tend to form in the voids of the porous low-k dielectric materials adjacent to the lines and the vias.

In the case of low-k dielectric inorganic and hybrid materials, cleaning of these materials presents a challenge in that traditional cleaning formulations are designed to remove etch residues through dissolution of the residue or slight etching of the dielectric to release the residue. But, with low-k dielectric materials, the increased surface area due to their porosity greatly increases their sensitivity to these cleaning formulations, reducing the selectivity of the formulation to the etch residue. Also, traditional dry cleaning methods such as ashing have unacceptable shortcomings because the ashing plasma tends to affect the organic content of the hybrid materials, thereby increasing the dielectric constant.

Currently, there are two basic systems in use: wet and dry. Dry is typically used for stripping and wet is usually used for cleaning. Wet systems use acids, bases or solvents, requiring several processing steps for residue removal. Dry systems are the preferred choice when dealing with organic photoresist material. Even when dry stripping systems are utilized, post-strip wet processing is still required to remove inorganic residues that the dry systems leave behind.

In semiconductor fabrication, a low-k dielectric material layer is generally patterned using a photoresist mask in one or more etching and ashing steps. These films, after etching or due to their physical nature, tend to have large numbers of silanol functionalities on their surfaces, and, due to their porous nature, present a large surface area of material to a cleaning formulation during cleaning. This presents the problem of substantial etching of the low-k dielectric material film with many cleaning formulations, often to the point of destroying the low-k dielectric material film.

To remove these silanol groups, the etch and photoresist residue in the lines and the vias, and the bulk photoresist from an exposed surface of the low-k dielectric material, a cleaning process is performed following the etching of the lines and the vias. In this cleaning process, a weak etchant is typically employed to remove a monolayer of the low-k dielectric material in order to release the etch residue, the photoresist, and the bulk photoresist. It has been found that this cleaning process results in an unacceptably high etch rate of the porous low-k dielectric materials. This is even true when the porous low-k dielectric materials are exposed to a weak etchant. Where the silanol groups exist, it has been found that significantly more than the monolayer of the low-k dielectric material is removed by the weak etchant.

Current high-dose implant cleaning has problems. When utilized, the resist gets heavily implanted, the hydrogen is driven from the resist's top third, and an extremely carbonized layer is produced. This carbonized layer is hard to remove and does not etch as quickly. Further, bulk resist with volatile components still exist underneath.

Even if normal stripping is utilized, there is a pressure build-up resulting in popping and blistering while cleaning at a slower rate. This not only contaminates the chamber, but these carbonized chunks also bond with exposed areas of the wafer's surface. In addition, standard high temperature oxygen-based plasmas do not work for low-k dielectric material cleaning. These high temperature and high-oxygen environments oxidize and degrade film integrity and low-k dielectric material properties.

What is needed is a method of treating porous low-k dielectric materials subsequent to etching and prior to cleaning which reduces the presence of silanol groups in the porous low-k dielectric materials. The challenge is to ensure the cleaning method is aggressive enough to clean the surface efficiently, without etching or altering the low-k material.

SUMMARY OF INVENTION

Today's microelectronic devices, with finer architectures and higher aspect ratios, require new low-k materials. There is a need for photoresist stripping technology to meet the challenges brought up by critical aspect ratios and shrinking sizes. Low-k dielectric material is a film for which the manufacturing processes require unprecedented levels of cleanliness. The low-k dielectric materials differ from typical features found in 0.25 μm architecture in that both vias and lines are etched into the dielectric layer, which can trap residues. In addition, current photoresists create tougher residues. The current invention provides a means to clean the vias and lines on the one hand, and to preserve a dielectric film, on the other.

The current invention addresses the greatest difficulty in cleaning exposed low-k materials: stripping. Stripping is a limitation due to the fact that a polymer is utilized for the low-k and an organic resist. Cleaning the resist or residues from low-k dielectric materials without affecting the low-k dielectric material is complicated. Usually, a hard mask is placed on the low-k dielectric material, to serve as an etch stop. The hard mask can also be used as a CMP stop. When etching, most of the bulk resist is removed. However, considerable residues and polymers are typically left on the sidewalls of the trench and vias. The current invention addresses the problems associated with removal of these residues and polymers but does not etch away the low-k dielectric material.

Standard 250° F. oxygen-based plasmas do not work for low-k dielectric material cleaning. High-oxygen environments oxidize and degrade film integrity and low-k dielectric material properties. The current invention provides chemical cleaning without additional physical cleaning to clean sidewalls and still be selective vis-à-vis the polymer. In addition, the current invention addresses current cleaning process shortcomings by utilizing lower temperatures during the cleaning process.

The preferred embodiment of the current invention is for use in conjunction with supercritical carbon dioxide ($SCCO_2$). In alternate embodiments of the current invention, a dry chemical ion-depleted downstream microwave plasma approach is utilized. In yet another embodiment of the current invention, a wet chemical process is utilized in conjunction with the current invention to achieve high selectivity and minimal low-k dielectric material damage.

The current invention clears the primary hurdle of ensuring that the stripper or residue remover does not attack or degrade the low-k dielectric material. Also, etching that results in a loss in thickness or widening of openings is minimized. Further, the k-value of the film is maintained or decreased through use of the present invention.

DETAILED DESCRIPTION OF THE PREFERRED EMBODIMENT

Figure 1A:
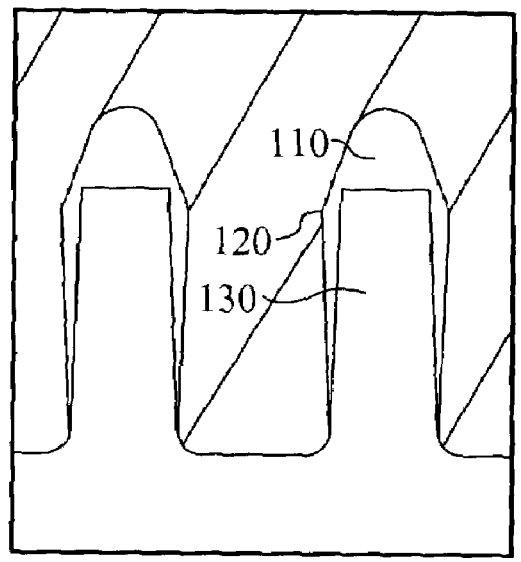
FIGS. 1A and 1B illustrate simplified schematics of a low-k dielectric material prior to and after removal of post-etch residue using the supercritical solution comprising supercritical carbon dioxide and a silicon-based passivating agent (i.e. a passivation processing step), followed by a cleaning solution processing step, in accordance with the instant invention.

Materials exhibiting low dielectric constants of between 3.5–2.5 are generally referred to as low-k dielectric materials. Porous materials with dielectric constant of 2.5 and below are generally referred to as ultra low-k (ULK) dielectric materials. For the purpose of this application low-k dielectric materials refer to both low-k dielectric and ultra low-k dielectric materials. Low-k dielectric materials are usually porous oxide-based materials and can include an organic or hydrocarbon component. Examples of low-k dielectric materials include, but are not limited to, carbon-doped oxide (COD), spin-on-glass (SOG) and fluorinated silicon glass (FSG) materials. These porous low-k dielectric material films typically contain carbon and hydrogen and are deposited by methods such as spin-on or CVD. These films are processed in such a way as to produce a film resistant to damage from cleaning formulations and typically have an inorganic matrix of either a SiOx base or a SiOx-CxHy base.

In accordance with the method of the present invention, a patterned low-k dielectric material layer is formed by depositing a continuous layer of a low-k dielectric material, etching a pattern in the low-k dielectric material using photolithography and removing post-etch residue using a supercritical solution comprising supercritical carbon dioxide and a silicon-based passivating agent (i.e. a passivation processing step), followed by a cleaning solution processing step.

The current invention acts to reduce or eliminate etching by reacting the silanol functionalities with a supercritical silylating agent, thereby reducing the rate of etch of the low-k dielectric material film in the cleaning formulation. The method of the present invention preferably passivates a layer of patterned low-k dielectric material layer by end-capping silanol groups on the surface and/or in the bulk of the low-k dielectric material to produce a patterned low-k dielectric material which is more hydrophobic, more resistant to contamination and/or less reactive. Following this passivation, the method of the present invention preferably cleans the film with minimal etching with a cleaning solution. In accordance with the embodiments of the present invention, a passivation processing step is carried out separately from a supercritical post-etch cleaning process or, alternatively, is carried out simultaneously with a supercritical post-etch cleaning process. Further, in accordance with the embodiments of the current invention, a cleaning solution processing step is carried out following a passivation processing step. In accordance with the embodiments of the present invention, a supercritical silylating agent comprises supercritical carbon dioxide and an amount of a passivating agent that is preferably a silylating agent. The silylating agent preferably comprises a silane structure $(R_1);(R_2);(R_3)$ $SiNH(R_4)$—Where $R_1$, $R_2$, $R_3$ could be the same or independently selected from the group H, alkyl, aryl, propyl, phenyl, and/or derivatives thereof as well as halogens (Cl, Br, F, I). $R_4$ could be $(SiR_1; R_2; R_3)$ in addition to being independently selected from the group H, alkyl, aryl, propyl, phenyl, and or derivatives thereof. In alternate embodiments, the silylating agent comprises a tetravalent organosilicon compound, wherein the silicon atom is coordinated to 4 ligands in the positions 1, 2, 3 and 4 in a pyramidal configuration. In yet another embodiment, the silylating agent comprises a silazane structure, which can be described as an amine structure with two organosilyl groups coordinated to the nitrogen of the amine.

The silylating agent can be introduced into supercritical carbon dioxide ($SCCO_2$) by itself or with a carrier solvent, such as N,-dimethylacetamide (DMAC), gamma-butyrolactone (BLO), dimethyl sulfoxide (DMSO), ethylene carbonate (EC) N-methylpyrrolidone (NMP), dimethylpiperidone, propylene carbonate, alcohol or combinations thereof, to generate the supercritical silylating agent. Preferably, $SCCO_2$ is used as a carrier fluid for the silylating agent. By using $SCCO_2$ as the carrier fluid, the silylating agent can be carried easily and quickly throughout the film, insuring complete and rapid reaction with the entire film.

It will be clear to one skilled in the art that a supercritical passivating solution with any number of silylating agents and combinations of silylating agents are within the scope of the present invention.

The thermodynamic conditions are variable: the process temperature is between 25 and 200° C. and the pressure is between 700 and 9000 psi. While supercritical $CO_2$ is preferred, under certain circumstances liquid $CO_2$ can be used. Preferably, the silylating agent comprises hexamethyldisilazane. Alternatively, the silylating agent comprises an organochlorosilane. Further alternatively, the silylating agent comprises a hydrolyzed alkoxysilane. The typical process time is between 15 seconds and 10 minutes.

Figure 1B:
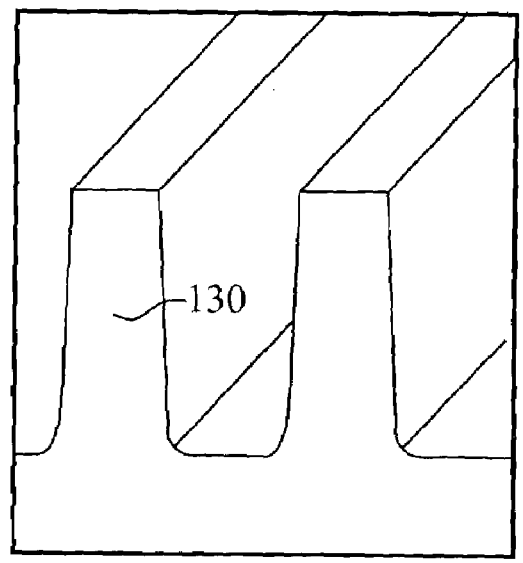

FIGS. 1A and 1B show a simplified schematic of a low-k dielectric material prior to and after removal of post-etch residue using the supercritical solution comprising supercritical carbon dioxide and a silicon-based passivating agent (i.e. a passivation processing step), followed by a cleaning solution processing step. The patterned low-k dielectric material 100 in FIG. 1A. 1A illustrates the patterned low-k dielectric material 100 prior to removal of post-etch residue and FIG. 1B illustrates the low-k dielectric material 100 following removal of post-etch residue. Specifically, the resist 110 and the sidewall polymer residue 120 can be seen on the low-k dielectric material structure 130 in FIG. 1A prior to the supercritical carbon dioxide cleaning and cleaning solution processing steps. FIG. 1B illustrates the same low-k dielectric material structure 130 after high-selectivity cleaning, showing no undercut and residue removal.

Figure 2:
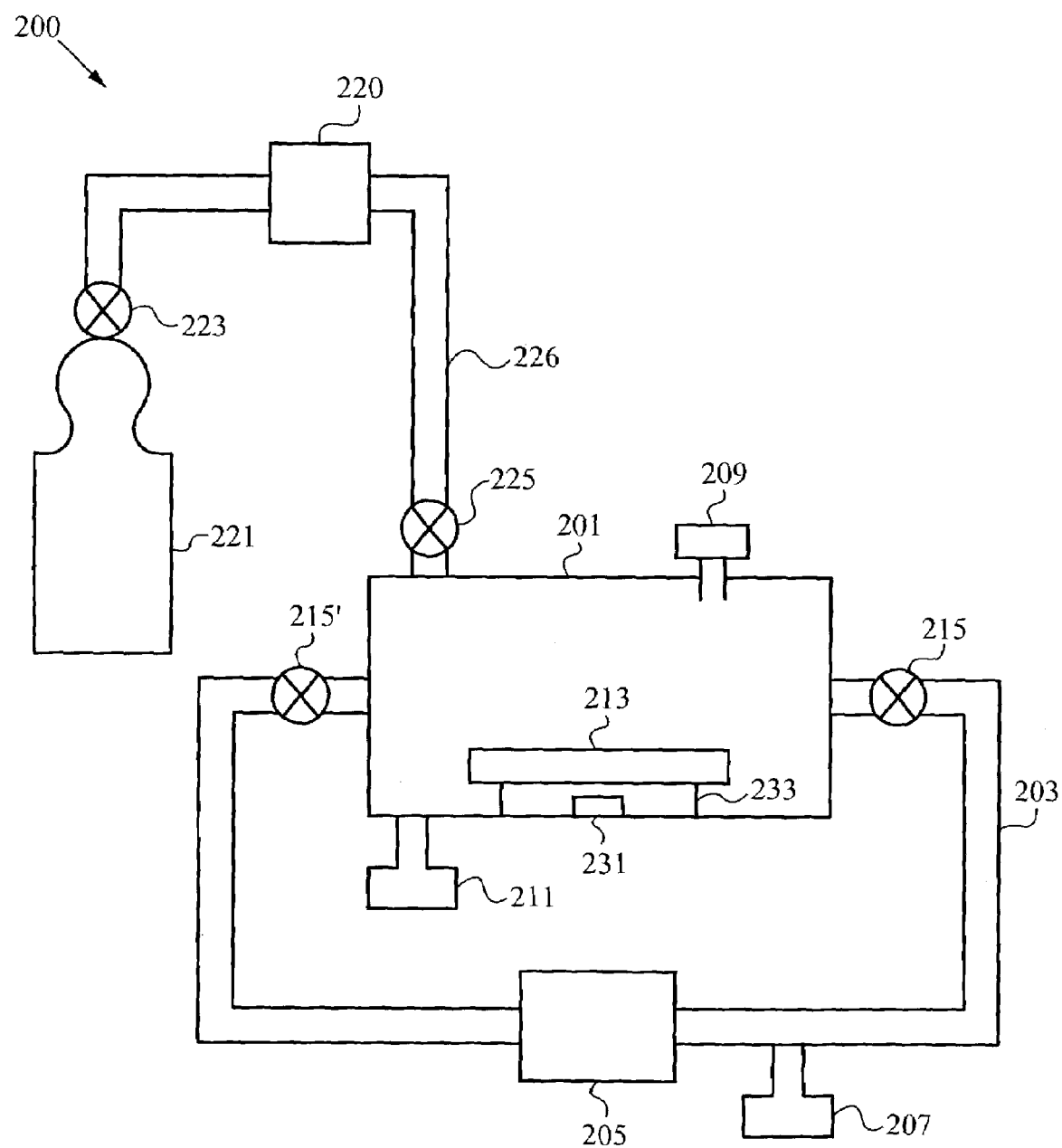
FIG. 2 illustrates a simplified schematic of a supercritical wafer processing apparatus, in accordance with the embodiments of the invention.

FIG. 2 shows a simplified schematic of a supercritical processing apparatus 200. The apparatus 200 comprises a carbon dioxide source 221 that is connected to an inlet line 226 through a source valve 223 which can be opened and closed to start and stop the flow of carbon dioxide from the carbon dioxide source 221 to the inlet line 226. The inlet line 226 is preferably equipped with one or more back-flow valves, pumps and heaters, schematically shown by the box 220, for generating and/or maintaining a stream of supercritical carbon dioxide. The inlet line 226 also preferably has an inlet valve 225 that is configured to open and close to allow or prevent the stream of supercritical carbon dioxide from flowing into a processing chamber 201.

Still referring to FIG. 2, the processing camber 201 is preferably equipped with one or more pressure valves 209 for exhausting the processing chamber 201 and/or for regulating the pressure within the processing chamber 201. Also in accordance with the embodiments of the invention, the processing chamber 201, is coupled to a pump and/or a vacuum 211 for pressurizing and/or evacuating the processing chamber 201.

Again referring to FIG. 2, within the processing chamber 201 of the apparatus 200 there is preferably a chuck 233 for holding and/or supporting a wafer structure 213. In accordance with further the embodiments of the invention, the chuck 233 and/or the processing chamber 201 has one or more heaters 231 for regulating the temperature of the wafer structure 213 and/or the temperature of a supercritical processing solution within the processing chamber 201.

The apparatus 200, also preferably has a circulation loop 203 that is coupled to the processing chamber 201. The circulation loop 203 is preferably equipped with one or more valves 215 and 215' for regulating the flow of a supercritical processing solution through the circulation loop 203 and through the processing chamber 201. The circulation loop 203, is also preferably equipped with any number back-flow valves, pumps and/or heaters, schematically represented by the box 205, for maintaining a supercritical processing solution and flowing the supercritical processing solution through the circulation loop 203 and through the processing chamber 201. In accordance with a preferred embodiment of the invention, the circulation loop 203 has an injection port 207 for introducing chemistry, such as passivating agents and solvents, into the circulation loop 203 for generating supercritical processing solutions in situ.

Figure 3:
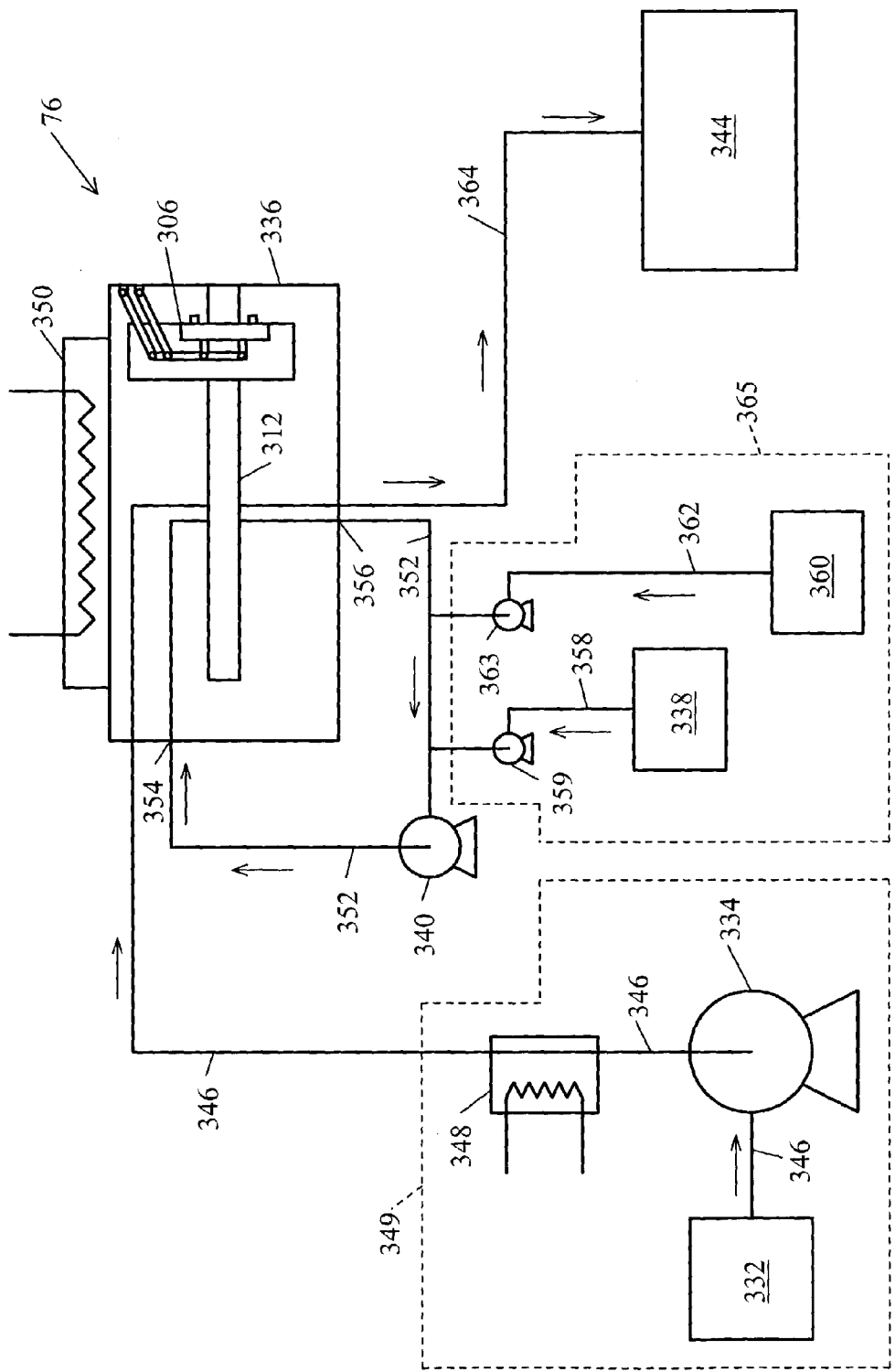
FIG. 3 illustrates a detailed schematic diagram of a supercritical processing apparatus, in accordance with the embodiments of the invention.

FIG. 3 shows a supercritical processing apparatus 76 in more detail than FIG. 2 described above. The supercritical processing apparatus 76 is configured for generating supercritical cleaning, rinse and curing solutions, and for treating a wafer therewith. The supercritical processing apparatus 76 includes a carbon dioxide supply vessel 332, a carbon dioxide pump 334, a processing chamber 336, a chemical supply vessel 338, a circulation pump 340, and an exhaust gas collection vessel 344. The carbon dioxide supply vessel 332 is coupled to the processing chamber 336 via the carbon dioxide pump 334 and carbon dioxide piping 346. The carbon dioxide piping 346 includes a carbon dioxide heater 348 located between the carbon dioxide pump 334 and the processing chamber 336. The processing chamber 336 includes a processing chamber heater 350. The circulation pump 340 is located on a circulation line 352, which couples to the processing chamber 336 at a circulation inlet 354 and at a circulation outlet 356. The chemical supply vessel 338 is coupled to the circulation line 352 via a chemical supply line 358, which includes a first injection pump 359. A rinse agent supply vessel 360 is coupled to the circulation line 352 via a rinse supply line 362, which includes a second injection pump 363. The exhaust gas collection vessel 344 is coupled to the processing chamber 336 via exhaust gas piping 364.

The carbon dioxide supply vessel 332, the carbon dioxide pump 334, and the carbon dioxide heater 348 form a carbon dioxide supply arrangement 349. The chemical supply vessel 338, the first injection pump 359, the rinse agent supply vessel 360, and the second injection pump 363 form a chemical and rinse agent supply arrangement 365.

It will be readily apparent to one skilled in the art that the supercritical processing apparatus 76 includes valving, control electronics, filters, and utility hookups which are typical of supercritical fluid processing systems.

Still referring to FIG. 3, in operation a wafer (not shown) with a residue thereon is inserted into the wafer cavity 312 of the processing chamber 336 and the processing chamber 336 is sealed. The processing chamber 336 is pressurized by the carbon dioxide pump 334 with the carbon dioxide from the carbon dioxide supply vessel 332 and the carbon dioxide is heated by the carbon dioxide heater 348 while the processing chamber 336 is heated by the processing chamber heater 350 to ensure that a temperature of the carbon dioxide in the processing chamber 336 is above a critical temperature. The critical temperature for the carbon dioxide is 31° C. Preferably, the temperature of the carbon dioxide in the processing chamber 336 is within a range of range of from 25° C. to about 200° C., and preferably at or near to 70° C., during a supercritical passivating step.

Upon reaching initial supercritical conditions, the first injection pump 359 pumps the processing chemistry, such as a silylating agent, from the chemical supply vessel 338 into the processing chamber 336 via the circulation line 352 while the carbon dioxide pump further pressurizes the supercritical carbon dioxide. At the beginning of the addition of processing chemistry to the processing chamber 336, the pressure in the processing chamber 336 is preferably in the range of about 700 to 9,000 psi and most preferably at or near 3,000 psi. Once a desired amount of the processing chemistry has been pumped into the processing chamber 336 and desired supercritical conditions are reached, the carbon dioxide pump 334 stops pressurizing the processing chamber 336, the first injection pump 359 stops pumping processing chemistry into the processing chamber 336, and the circulation pump 340 begins circulating supercritical carbon dioxide and a cleaning solution. Finally, the circulation pump 340 begins circulating the supercritical cleaning solution comprising the supercritical carbon dioxide and the processing chemistry. Preferably, the pressure within the processing chamber 336 at this point is about 3000 psi. By circulating the supercritical cleaning solution and the supercritical processing solution, the supercritical solvent and solution are replenished quickly at the surface of the wafer thereby enhancing the rate of passivating and cleaning of the surface of a low-k dielectric material layer on the wafer.

When a wafer (not shown) with a low-k dielectric material layer is being processed within the pressure chamber 336, the wafer is held using a mechanical chuck, a vacuum chuck or other suitable holding or securing means. In accordance with the embodiments of the invention the wafer is stationary within the processing chamber 336 or, alternatively, is rotated, spun or otherwise agitated during the supercritical process step.

After the supercritical processing solution is circulated though circulation line 352 and the processing chamber 336, the processing chamber 336 is partially depressurized by exhausting some of the supercritical process solution to the exhaust gas collection vessel 344 in order to return conditions in the processing chamber 336 to near the initial supercritical conditions. Preferably, the processing chamber 336 is cycled through at least one such decompression and compression cycle before the supercritical processing solutions are completely exhausting the processing chamber 336 to the exhaust into the collection vessel 344. After exhausting the pressure chamber 336 a second supercritical process step is performed or the wafer is removed from the processing chamber 336, and the wafer processing continues in a second processing apparatus or module (not shown).

Figure 4:
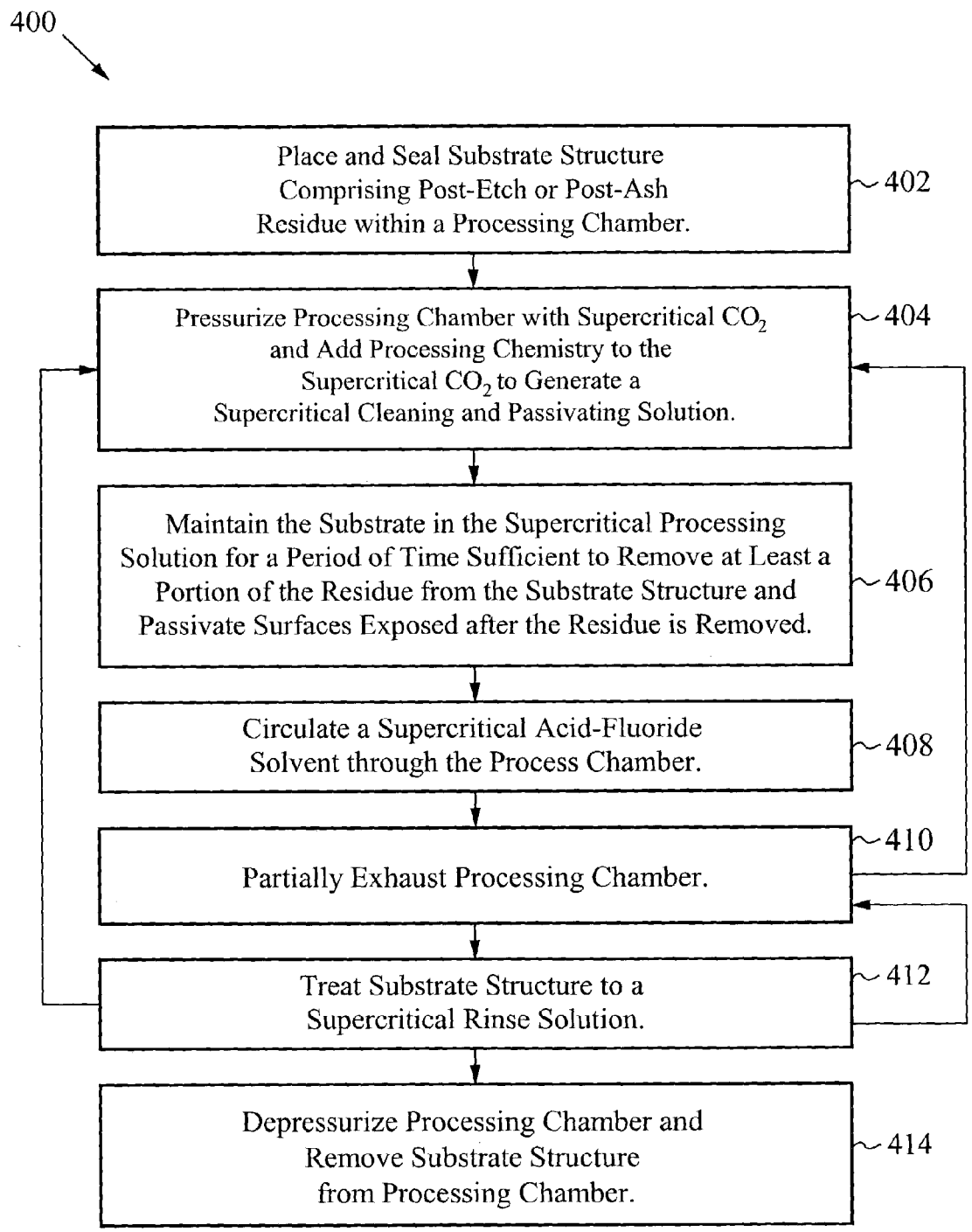
FIG. 4 illustrates a schematic block diagram outlining steps for treating a silicon oxide-based low-k dielectric material layer, in accordance with the embodiments of the present invention.

FIG. 4 is a block diagram 400 outlining steps for treating a substrate structure comprising a patterned low-k dielectric material layer and post-etch or post-ash residue thereon using a supercritical cleaning and passivating solution. In the step 402 the substrate structure comprising the post-etch residue is placed and sealed within a processing chamber. After the substrate structure is placed into and sealed within processing chamber in the step 402, in the step 404 the processing chamber is pressurized with supercritical $CO_2$ and processing chemistry is added to the supercritical $CO_2$ to generate a supercritical cleaning and passivating solution. Preferably, the cleaning and passivating chemistry comprises at least one organosilicon compound.

After the supercritical cleaning and passivating solution is generated in the step 404, in the step 406 the substrate structure is maintained in the supercritical processing solution for a period of time sufficient to remove at least a portion of the residue from the substrate structure and passivate surfaces exposed after the residue is removed. During the step 406, the supercritical cleaning and passivating solution is preferably circulated through the processing chamber and/or otherwise agitated to move the supercritical cleaning solution over surfaces of the substrate structure. This cleaning step can also be performed after passivation, before passivation or during passivation.

Still referring to FIG. 4, after at least a portion of the residue is removed from the substrate structure in the step 406, in the step 408, a supercritical cleaning solution processing step occurs in which a supercritical cleaning solution is preferably circulated through the processing chamber and/or otherwise agitated to move the supercritical solvent over surfaces of the substrate structure. Following the supercritical cleaning solution processing step 408, the processing chamber is partially exhausted in the step 410. The cleaning process comprising steps 404, 406, and 408 are repeated any number of times, as indicated by the arrow connecting the steps 410 to 404, required to remove the residue from the substrate structure and passivate the surfaces exposed. The processing comprising steps 404, 406, and 408, in accordance with the embodiments of the invention, use fresh supercritical carbon dioxide, fresh chemistry or both. Alternatively, the concentration of the cleaning chemistry is modified by diluting the processing chamber with supercritical carbon dioxide, by adding additional charges of cleaning chemistry or a combination thereof.

Still referring to FIG. 4, after the processing steps 404, 406, 408, and 410 are complete, in the step 412 the substrate structure is preferably treated to a supercritical rinse solution. The supercritical rinse solution preferably comprises supercritical $CO_2$ and one or more organic solvents, but can be pure supercritical $CO_2$.

Still referring to FIG. 4, after the substrate structure is cleaned in the steps 404, 406, 408, and 410 and rinsed in the step 412, in the step 414 the processing chamber is depressurized and the substrate structure is removed from the processing chamber. Alternatively, the substrate structure is cycled through one or more additional cleaning/rinse processes comprising the steps 404, 406, 408, 410, and 412 as indicated by the arrow connecting steps 412 and 404. Alternatively, or in addition to cycling the substrate structure through one or more additional cleaning/rinse cycles, the substrate structure is treated to several rinse cycles prior to removing the substrate structure from the chamber in the step 414, as indicated by the arrow connecting the steps 412 and 410.

As described previously, the substrate structure can be dried and/or pretreated prior to passivating the low-k dielectric material layer thereon by using a supercritical solution comprising supercritical carbon dioxide and one or more solvents such as methanol, ethanol, and/or a combination thereof. Also, as mentioned previously pretreating the low-k dielectric material layer with supercritical solution comprising supercritical carbon dioxide with or without cosolvents appears to improve the coverage of the silyl-groups on surface of the low-k dielectric material layer. Also, it will be clear to one skilled in the art that a wafer comprising a post-etch residue and/or a patterned low-k dialectic material layer can be treated to any number cleaning and passivating steps and/or sequences.

It will be understood by one skilled in the art, that while the method of passivating low-k dielectric material has been primarily described herein with reference to a post-etch treatment and/or a post-etch cleaning treatment, the method of the present invention can be used to directly passivate low-k dielectric materials. Further, it will be appreciated that when treating a low-k dielectric material, in accordance with the method of the present invention, a supercritical rinse step is not always necessary and simply drying the low-k dielectric material prior treating the low-k dielectric material with a supercritical passivating solution can be appropriate for some applications.

What is claimed is:

1. A method of treating a low-k dielectric material surface comprising:
   a. treating the low-k dielectric material surface to a supercritical silylating agent to form a passivated low-k dielectric material surface;
   b. removing the supercritical silylating agent following treating the low-k dielectric material surface to the supercritical silylating agent;
   c. treating the passivated low-k dielectric material surface to a supercritical solvent solution; and
   d. removing the supercritical solvent solution following treating the passivated low-k dielectric material surface to the supercritical solvent solution.

2. The method of claim 1, wherein the supercritical silylating agent comprises supercritical $CO_2$ and an amount of a silylating agent comprising organic groups.

3. The method of claim 2, wherein the organic groups comprise 5 carbon atoms or fewer.

4. The method of claim 1, wherein the supercritical solvent solution comprises supercritical $CO_2$ and a mixture of acids and fluorides.

5. The method of claim 4, wherein the acids comprise organic acids.

6. The method of claim 5, wherein the carrier solvent is selected from the group consisting of N,N-dimethylacetamide (DMAC), gamma-butyrolacetone (BLO), dimethyl sulfoxide (DMSO), ethylene carbonate (EC), N-methylpyrrolidone (NMP), dimethylpiperidone, propylene carbonate and alcohol.

7. The method of claim 4, wherein the acids comprise inorganic acids.

8. The method of claim 1, wherein the supercritical silylating agent includes silane having the structure $(R_1)$, $(R_2),(R_3)SiNH(R_4)$.

9. The method of claim 1, wherein the supercritical silylating agent further comprises a carrier solvent.

10. The method of claim 1, wherein the low-k dielectric material surface is maintained at temperatures in a range of 25 to 200 degrees Celsius.

11. The method of claim 10, wherein drying the low-k dielectric material surface comprises treating the low-k dielectric material surface to a supercritical drying solution comprising supercritical carbon dioxide.

12. The method of claim 1, wherein treating the low-k dielectric material surface to a supercritical silylating agent comprises circulating the supercritical silylating agent over the low-k dielectric material surface.

13. The method of claim 1, wherein treating the low-k dielectric material surface to a supercritical solvent solution comprises circulating the supercritical solvent solution over the low-k dielectric material surface.

14. The method of claim 1, wherein the supercritical silylating agent is maintained at pressures in a range of 700 to 9,000 psi.

15. The method of claim 1, further comprising drying the low-k dielectric material surface prior to treating the low-k dielectric material surface to a supercritical silylating agent.

16. The method of claim 1, wherein the low-k dielectric material surface comprises silicon oxide.

17. The method of claim 1, wherein the low-k dielectric material surface comprises a material selected from the group consisting of a carbon doped oxide (COD), a spin-on-glass (SOG) and fluoridated silicon glass (FSG).

18. A method of treating a low-k dielectric surface, comprising:
   a. removing post etch residue from the low-k dielectric surface with a first supercritical cleaning solution;
   b. treating the low-k dielectric surface with a silylating agent to form a passivated dielectric surface, wherein the silylating agent is in a second supercritical cleaning solution; and
   c. treating the passivated dielectric surface with a solvent, wherein the solvent is in a third supercritical cleaning solution.

19. The method of claim 18, wherein the post etch residue comprises a polymer.

20. The method of claim 19, wherein the polymer is a photoresist polymer.

21. The method of claim 20, wherein the photoresist polymer comprises an anti-reflective dye.

22. The method of claim 18, wherein the dielectric surface comprises silicon oxide.

23. The method of claim 18, wherein the dielectric surface comprises low-k dielectric material.

24. The method of claim 18, wherein the dielectric surface comprises a material selected from the group consisting of a carbon doped oxide (COD), a spin-on-glass (SOG) and fluoridated silicon glass (FSG).

25. The method of claim 18, wherein the post etch residue comprises an anti-reflective coating.

26. The method of claim 18, wherein the silylating agent comprises an organosilicon compound.

27. The method of claim 26, wherein the organosilicon compound is agent is silane having the structure $(R_1),(R_2), (R_3)SiNH(R_4)$.

28. The method of claim 18, wherein the solvent comprises a supercritical $CO_2$ and a mixture of acids and fluorides.

* * * * *